US010790470B1

United States Patent
Li

(10) Patent No.: US 10,790,470 B1
(45) Date of Patent: Sep. 29, 2020

(54) FLEXIBLE DISPLAY PANEL AND FABRICATION METHOD, AND FLEXIBLE DISPLAY DEVICE THEREOF

(71) Applicant: Shanghai Tianma Micro-Electronics Co., Ltd., Shanghai (CN)

(72) Inventor: Jialing Li, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/457,945

(22) Filed: Jun. 29, 2019

(30) Foreign Application Priority Data

Mar. 29, 2019 (CN) .......................... 2019 1 0247319

(51) Int. Cl.
*H01L 27/32* (2006.01)
*H01L 51/52* (2006.01)
*H01L 51/56* (2006.01)
*H01L 51/00* (2006.01)

(52) U.S. Cl.
CPC ...... *H01L 51/5253* (2013.01); *H01L 27/3227* (2013.01); *H01L 27/3234* (2013.01); *H01L 27/3258* (2013.01); *H01L 51/0097* (2013.01); *H01L 51/5275* (2013.01); *H01L 51/56* (2013.01)

(58) Field of Classification Search
CPC .................................................. H01L 51/5253
See application file for complete search history.

(56) References Cited

U.S. PATENT DOCUMENTS

2017/0346041 A1* 11/2017 Kim .................... H01L 27/3244

FOREIGN PATENT DOCUMENTS

| CN | 105914224 A | 8/2016 |
| CN | 207637803 U | 7/2018 |
| CN | 108461659 A | 8/2018 |

* cited by examiner

*Primary Examiner* — William A Harriston
(74) *Attorney, Agent, or Firm* — Anova Law Group PLLC

(57) ABSTRACT

A flexible display panel and fabrication method, and a flexible display device are provided. The flexible display panel includes a flexible substrate, and a light-emitting function layer including an inorganic insulating layer. The flexible display panel also includes a display region and a non-display region disposed around the display region. The non-display region includes a blocking region, and the blocking region includes a blocking structure. The blocking structure includes an inclined portion, and the inclined portion has a same thickness at least in a first direction. Further, the flexible display panel includes a thin-film encapsulation layer at least covering the blocking structure in the first direction and including an inclined segment. The inclined segment has a same thickness at least in the first direction, and the first direction is a direction perpendicular to a plane of the flexible substrate.

20 Claims, 9 Drawing Sheets

FLEXIBLE DISPLAY PANEL AND FABRICATION METHOD, AND FLEXIBLE DISPLAY DEVICE THEREOF

CROSS-REFERENCES TO RELATED APPLICATIONS

This application claims the priority of Chinese patent application No. 201910247319.7, filed on Mar. 29, 2019, the entirety of which is incorporated herein by reference.

FIELD OF THE DISCLOSURE

The present disclosure generally relates to the field of display technology and, more particularly, relates to a flexible display panel and fabrication method, and a flexible display device thereof.

BACKGROUND

In the production process of a display panel, to prevent water and oxygen from penetrating into the inside of components and causing failure of the components, thin-film encapsulation (TFF) has to be performed on the display panel. The thin-film encapsulation technology utilizes one or more layers of inorganic materials or a composition of inorganic/organic materials to implement water resistance and oxygen resistance. The thin-film encapsulation technology is featured with advantages such as reducing device thickness, reducing cost and weight, and improving flexibility and robustness.

A cutting process has to be performed after performing the thin-film encapsulation. During the cutting process, due to the influence of the internal stress of the inorganic encapsulation layer at an edge of a non-display region and the edge affected by external forces, cracks tend to be generated at the edge of the display panel. When the cracks expand to a display region, a water and oxygen penetration channel will be formed to cause defects in the display region, which causes a color missing issue at the edge of the display region, etc.

Conventionally, such defects are often overcome by disposing a dam in the non-display region. However, as the integration degree of the display panel increases, integrated devices increasingly tend to be disposed in the non-display region. In a direction perpendicular to the display panel, after the light passes through the dam, due to the difference in optical path difference of the light, both an angle of the light and an amount of phase delay of the light change, which cause local distortion and blurring of the image and local distortion of a phase detection image. The disclosed flexible display panel and fabrication method, and the flexible display device are directed to solve one or more problems set forth above and other problems.

BRIEF SUMMARY OF THE DISCLOSURE

One aspect of the present disclosure provides a flexible display panel. The flexible display panel includes a flexible substrate, and a light-emitting function layer disposed on a side of the flexible substrate. The light-emitting function layer includes an inorganic insulating layer. The flexible display panel also includes a display region and a non-display region disposed around the display region. The non-display region includes at least one barrier wall disposed around the display region, and a blocking region disposed on a side of the barrier wall away from the display region. The blocking region includes a blocking structure disposed on a side of the inorganic insulating layer away from the flexible substrate. The blocking structure includes an inclined portion, and the inclined portion has a same thickness at least in a first direction. Further, the flexible display panel includes a thin-film encapsulation layer disposed on a side of the light-emitting function layer facing away from the flexible substrate. The thin-film encapsulation layer at least covers the blocking structure in the first direction. The thin-film encapsulation layer includes at least one inorganic encapsulation layer, and the inorganic encapsulation layer disposed in the blocking region includes an inclined segment. The inclined segment has a same thickness at least in the first direction, and the first direction is a direction perpendicular to a plane of the flexible substrate.

Another aspect of the present disclosure provides a fabrication method for forming a flexible display panel. The fabrication method includes providing a flexible substrate, and providing a light-emitting function layer. The light-emitting function layer is disposed on a side of the flexible substrate, and the light-emitting function layer includes an inorganic insulating layer. The fabrication method also includes providing a thin-film encapsulation layer. The thin-film encapsulation layer is disposed on a side of the light-emitting function layer facing away from the flexible substrate, and the thin-film encapsulation layer includes at least one inorganic encapsulation layer. The flexible display panel includes a display region and a non-display region disposed around the display region. At least one barrier wall is disposed in the non-display region and around the display region to form a blocking region in the non-display region. The blocking region is located on a side of the barrier wall away from the display region, and the blocking region includes at least two blocking structures disposed on a side of the inorganic insulating layer away from the flexible substrate. A blocking structure of the at least two blocking structures includes an inclined portion, and the inclined portion has a same thickness at least in a first direction. The thin-film encapsulation layer at least covers the blocking structure in the first direction. The inorganic encapsulation layer disposed in the blocking region includes an inclined segment. The inclined segment has a same thickness at least in the first direction, and the first direction is a direction perpendicular to a plane of the flexible substrate.

Another aspect of the present disclosure provides a flexible display device. The flexible display device includes the disclosed flexible display panel.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

To fabricate a display device in the prior art, a cutting process has to be performed after performing the thin-film encapsulation. During the cutting process, due to the influence of the internal stress of the inorganic encapsulation layer at an edge of a non-display region and the edge affected by external forces, cracks tend to be generated at the edge of the display panel. When the cracks expand to a display region, a water and oxygen penetration channel will be formed to cause defects in the display region, which causes a color missing issue at the edge of the display region, etc.

Such defects are often overcome by disposing a dam in the non-display region. However, as the integration degree of the display panel increases, integrated devices increasingly tend to be disposed in the non-display region. In a direction perpendicular to the display panel, after the light passes through the dam, due to the difference in optical path difference of the light, an angle of the light changes, which causes local distortion and blurring of the image. To solve one or more problems set forth above, the present disclosure provides a flexible display panel and a fabrication method, and a flexible display panel.

Figure 1:
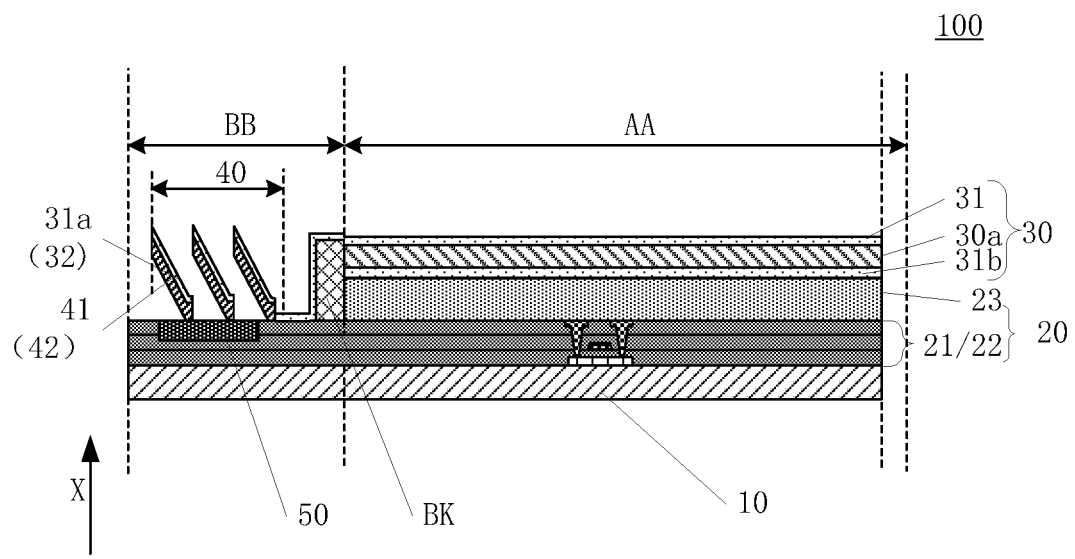
FIG. 1 illustrates a schematic sectional view of an exemplary flexible display panel consistent with disclosed embodiments of the present disclosure.
Figure 2:
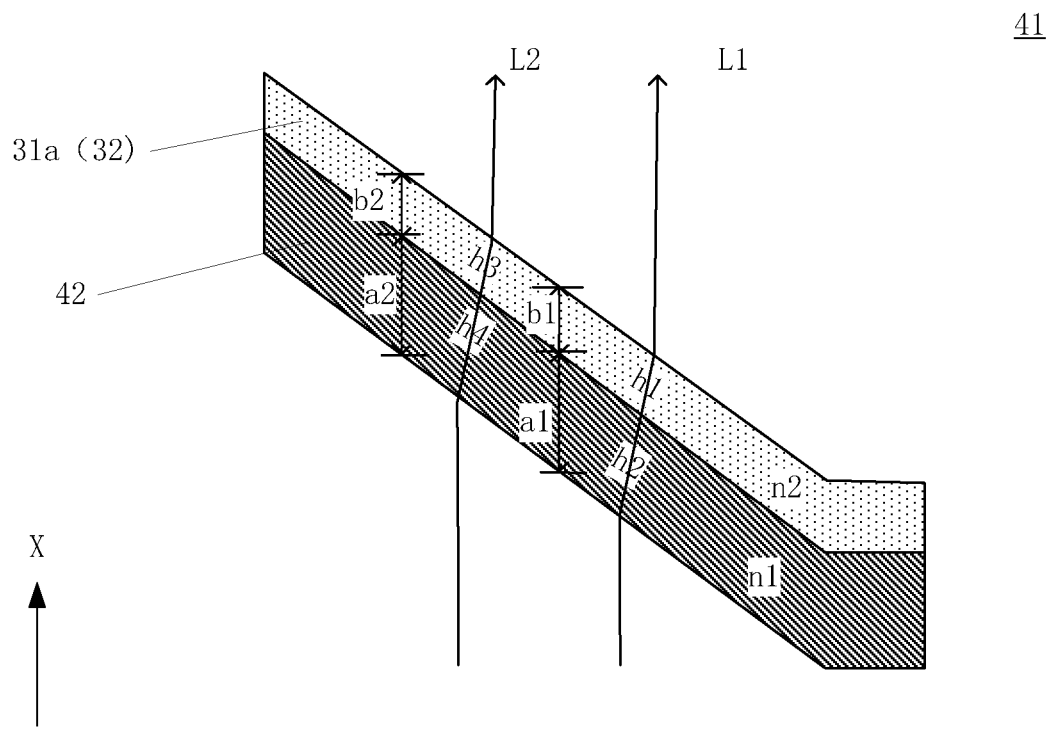
FIG. 2 illustrates a schematic diagram of a blocking structure of an exemplary flexible display panel in FIG. 1 consistent with disclosed embodiments of the present disclosure.

FIG. 1 illustrates a schematic sectional view of a flexible display panel consistent with disclosed embodiments of the present disclosure; and FIG. 2 illustrates a schematic diagram of a blocking structure of the flexible display panel in FIG. 1. Referring to FIG. 1 and FIG. 2, the flexible display panel 100 may include a flexible substrate 10, a light-emitting function layer 20 disposed on a side of the flexible substrate. The light-emitting function layer 20 may include an inorganic insulating layer 21. The flexible display panel 100 may also include a display region AA and a non-display region BB disposed around the display region AA.

The non-display region BB may include at least one barrier wall BK disposed around the display region AA. The non-display region BB may also include a blocking region 40 disposed on a side of the barrier wall BK away from the display region AA. The blocking region 40 may include a blocking structure 41 disposed on a side of the inorganic insulating layer 21 away from the flexible substrate 10. The blocking structure 41 may include an inclined portion 42, and the inclined portion 42 may have a same thickness at least in a first direction X. Referring to FIG. 2, the thickness of the inclined portion 42 in the first direction X may include a1 and a2, and a1=a2. The inclined portion 42 in the disclosed embodiments may refer to a portion of the blocking structure 41 that has a certain angle with respect to the plane of the flexible substrate 10, i.e., a portion of the blocking structure 41 that is not parallel to the plane of the flexible substrate 10.

The flexible display panel 100 may also include a thin-film encapsulation layer 30 disposed on a side of the light-emitting function layer 20 facing away from the flexible substrate 10. At least one film layer of the thin-film encapsulation layer 30 may cover at least the blocking structure 41 in the first direction X. The thin-film encapsulation layer 30 may include at least one inorganic encapsulation layer 31. An inorganic encapsulation layer 31a disposed in the blocking region 40 may include an inclined segment 32, and the inclined segment 32 may have a same thickness at least in the first direction X. The first direction X may be a direction perpendicular to the plane of the flexible substrate 10. Referring to FIG. 2, the thickness of the inclined segment 32 in the first direction X may include b1 and b2, and b1=b2. The inclined segment 32 in the disclosed embodiments may refer to a portion of the inorganic encapsulation layer 31a that has a certain angle with respect to the plane of the flexible substrate 10, i.e., a portion of the inorganic encapsulation layer 31a that is not parallel to the plane of the flexible substrate 10.

The thin-film encapsulation layer 30 may be a laminated structure including the inorganic encapsulation layer 31, an organic encapsulation layer 30a, and an inorganic encapsulation layer 31b. The specific structure of the thin-film encapsulation layer 30 is not limited by the present disclosure. The thin-film encapsulation layer 30 may include a plurality of inorganic encapsulation layers and a plurality of organic encapsulation layers 30a, which may be determined by forming a desired protection layer for the devices in the display region AA. Referring to FIG. 1, the inorganic encapsulation layer 31a in the blocking region 40 and the inorganic encapsulation layer 31b in the display region may be made of a same material and fabricated by a same process. Referring to FIG. 1, the inorganic encapsulation layer 31a and the inorganic encapsulation layer 31 may be the same inorganic encapsulation layer. To distinguish the inorganic encapsulation layer covering the blocking structure 41 in the non-display region BB from the inorganic encapsulation layer in the display region AA, the inorganic encapsulation layer covering the blocking structure 41 in the non-display region BB is referenced 31a, and the inorganic encapsulation layer in display region AA is referenced 31.

Referring to FIG. 1, the blocking structure 41 may be disposed in the blocking region 40, and the blocking structure 41 may include the inclined portion 42. To enable the inclined portion to be stably disposed on the inorganic insulating layer 21, the blocking structure 41 may further include a non-inclined portion for fixing the inclined portion 42, which is not limited by the present disclosure.

In the disclosed embodiments, the inclined portion 42 of the blocking structure 41 may have to have a same thickness at least in the first direction X, and at the same time, the inclined segment 32 of the inorganic encapsulation layer 31a in the blocking region 40 may have to have a same thickness at least in the first direction X. The light-emitting function layer 20 may include an array layer 22 and an organic light-emitting layer 23. The array layer 22 may include the inorganic insulating layer 21 and a driving circuit. For illustrative purposes, FIG. 1 merely illustrates the driving circuit including thin film transistors, and the specific structure of the array layer 22 is not limited by the present disclosure. The inorganic insulating layer 21 may further include a buffer layer, a gate insulating layer and an interlayer insulating layer. In certain embodiments, the inorganic insulating layer 21 may further include other film layers, which are not limited by the present disclosure.

For illustrative purposes, FIG. 1 merely illustrates three blocking structures 41. One or more blocking structures 41 may be disposed according to practical applications, and a quantity of the blocking structures 41 is not limited by the present disclosure.

Both the inorganic encapsulation layer 31a and the blocking structure 41 in FIG. 1 and FIG. 2 may be uniform. The blocking structure may be made of a material having a refractive index of n1. The inorganic encapsulation layer may be made of a material having a refractive index of n2. Referring to FIG. 2, the light L1 and the light L2 each passing through the blocking structure 41 may have a same optical path, and such details may include the following.

The optical path of the light L1 passing through the blocking structure 41 is $SL1=h2\times n1+h1\times n2$.

The optical path of the light L2 passing through the blocking structure 41 is $SL2=h4\times n1+h3\times n2$.

Because b1=b2, a1=a2, the inorganic encapsulation layer 31a is uniform, and the blocking structure 41 is uniform, after passing through the inorganic encapsulation layer 31a and the blocking structure 41, the refracted light of the light L1 may be parallel to the refracted light of the light L2. According to the principles of similar triangles, h1=h3 and h2=h4, thus SL1=SL2. In other words, the optical path of the light L1 may be equal to the optical path of the light L2. In the disclosed embodiments, when passing through the inclined portion 42 and the inclined segment 32, the light may have a same optical path.

In one embodiment, the non-display region BB may further include an integrated device 50 disposed on the inorganic insulating layer 21. An orthogonal projection of the integrated device 50 on the flexible substrate 10 may at least partially overlap with an orthogonal projection of the blocking region 40 on the flexible substrate 10. In certain embodiments, the integrated device may be an optical detecting device, or an optical imaging device, etc. The integrated device may be disposed on a side surface of the flexible substrate away from the light-emitting function layer, and an orthogonal projection of the location where the integrated device is disposed on the flexible substrate may at least partially overlap with an orthogonal projection of the blocking region on the flexible substrate.

In the flexible display panel in the disclosed embodiments, referring to FIG. 1, the non-display region BB of the flexible display panel 100 may include at least one barrier wall BK disposed around the display region AA. The non-display region BB may also include the blocking region 40 disposed on the side of the barrier wall BK away from the display region AA. The blocking region 40 may include the blocking structure 41 disposed on the side of the inorganic insulating layer 21 away from the flexible substrate 10. The blocking structure 41 may include the inclined portion 42, and the inclined portion 42 may have a same thickness at least in the first direction X (a1=a2). The inorganic encapsulation layer 31a disposed in the blocking region 40 may include the inclined segment 32, and the inclined segment 32 may have a same thickness at least in the first direction X (b1=b2).

On the one hand, the disposure of the blocking structure 41 in the blocking region 40 may disconnect the inorganic encapsulation layer 31a in a direction directed from the non-display region BB to the display region AA. Thus, the path of water and oxygen entering the inside of the inorganic encapsulation layer 31 may be blocked, a risk of failure caused by expansion of the cracks at the edge of the flexible display panel 100 may be reduced, and the reliability of the edge encapsulation of the flexible display panel 100 may be improved.

On the other hand, the inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the inclined segment 32 in the blocking region 40, the light may have a same optical path difference, and, thus, the propagation of the light may not be affected, thereby ensuring the accuracy of the light-exiting direction.

The inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light may have an equal amount of phase delay. When an integrated device for detecting phase is disposed on the inorganic insulating layer 21, the detected image may not have local distortion.

The phase delay may refer to postponement of the phase due to the deflection of the light when passing through the substance having two-phase or multi-directionality. Phase delay is common in optical materials for liquid-crystal displays. In the disclosed embodiments, when the light passes through the blocking region 40, because the blocking structure 41 and the inorganic encapsulation layer 31a are disposed in the blocking region 40, phase delay may occur. However, because the inclined portion 42 of the blocking structure 41 has a same thickness at least in the first direction X, and the inclined segment 32 of the inorganic encapsulation layer 31a in the blocking region 40 has a same thickness at least in the first direction X, different light passing through the blocking region 40 may have the equal amount of phase delay. Thus, the detected image of the integrated device for detecting phase may not have local distortion.

Figure 3:
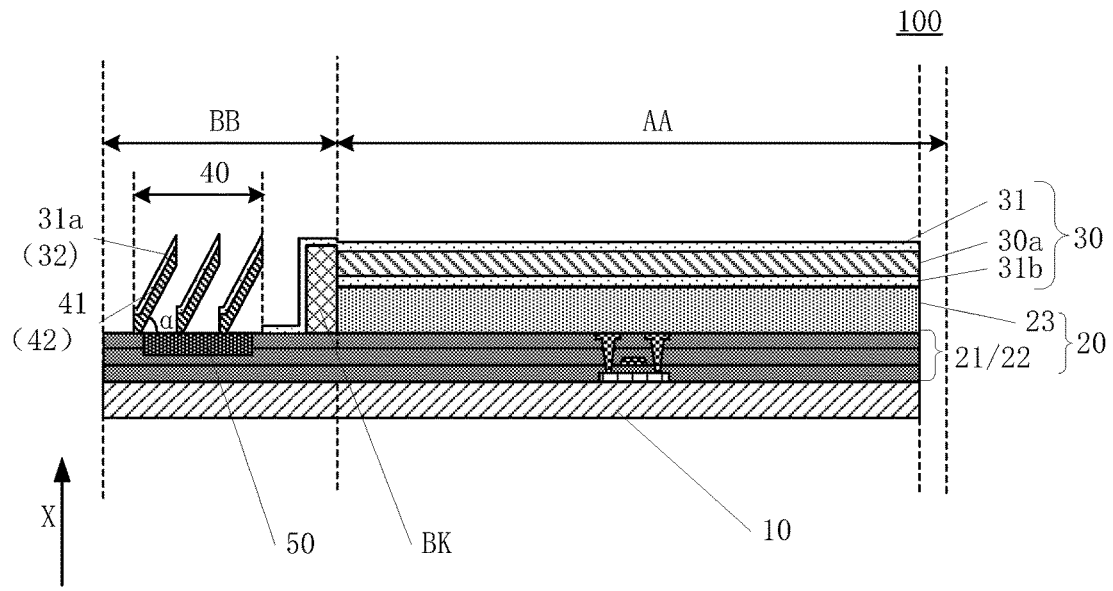
FIG. 3 illustrates a schematic sectional view of another exemplary flexible display panel consistent with disclosed embodiments of the present disclosure.

FIG. 3 illustrates a schematic sectional view of another exemplary flexible display panel consistent with disclosed embodiments of the present disclosure. Referring to FIG. 3, the non-display region BB may further include the integrated device 50 disposed on the inorganic insulating layer 21. An orthogonal projection of the integrated device 50 on the flexible substrate 10 may at least partially overlap with the orthogonal projection of the blocking region 40 on the flexible substrate 10.

Referring to FIG. 3, the non-display region BB of the flexible display panel 100 may include at least one barrier wall BK disposed around the display region AA. The non-display region BB may also include the blocking region 40 disposed on the side of the barrier wall BK away from the display region AA. The blocking region 40 may include the blocking structure 41 disposed on the side of the inorganic insulating layer 21 away from the flexible substrate 10. The blocking structure 41 may include the inclined portion 42, and the inclined portion 42 may have a same thickness at least in the first direction X. The inorganic encapsulation layer 31a disposed in the blocking region 40 may include the inclined segment 32, and the inclined segment 32 may have a same thickness at least in the first direction X. The orthogonal projection of the integrated device 50 on the flexible substrate 10 may at least partially overlap with the orthogonal projection of the blocking region 40 on the flexible substrate 10.

For illustrative purposes, FIG. 3 illustrates that the orthogonal projection of the integrated device 50 on the flexible substrate 10 partially overlaps with the orthogonal projection of the blocking region 40 on the flexible substrate 10. The inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light emitted by the integrated device 50 may have a same optical path difference. Thus, the propagation of light may not be affected, thereby ensuring the accuracy of the light-exiting direction.

In another embodiment, according to practical applications, the orthogonal projection of the integrated device 50 on the flexible substrate 10 may fully overlap with the orthogonal projection of the blocking region 40 on the flexible substrate 10, which is not illustrated herein. The case where the orthogonal projections are fully overlapped may have a same principle as the case where the orthogonal projections are partially overlapped. The inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light emitted by the integrated device 50 may have a same optical path difference. Thus, the propagation of light may not be affected, thereby ensuring the accuracy of the light-exiting direction. In the disclosed embodiments, when passing through the inclined portion 42 and the inclined segment 32, the light may have an equal optical path.

In the disclosed embodiments, the inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light may have an equal amount of phase delay. When an integrated device for detecting phase is disposed on the inorganic insulating layer 21, the detected image may not have local distortion.

In certain embodiments, an angle between the inclined portion 42 and the flexible substrate 10 may be an acute angle or an obtuse angle. Referring to FIG. 3, an angle α between the inclined portion 42 and the flexible substrate 10 may be an acute angle. In other words, the inclined portion 42 may be inclined toward the display region AA. In view of this, because the inorganic encapsulation layer 31a and the inorganic encapsulation layer 31 in the display region AA are disconnected, and the barrier wall BK is disposed on the periphery of the display region AA, the path of water and oxygen entering the inside of the display region AA may be blocked. Therefore, water and oxygen may be effectively prevented from entering the inside of the display region AA from the inorganic encapsulation layer 31, the risk of failure caused by expansion of cracks at the edge of the flexible display panel 100 may be reduced, and the reliability of the edge encapsulation of the flexible display panel 100 may be improved.

Further, the inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light emitted by the integrated device 50 may have a same optical path difference. Thus, the propagation of light may not be affected, thereby ensuring the accuracy of the light-exiting direction.

Figure 4:
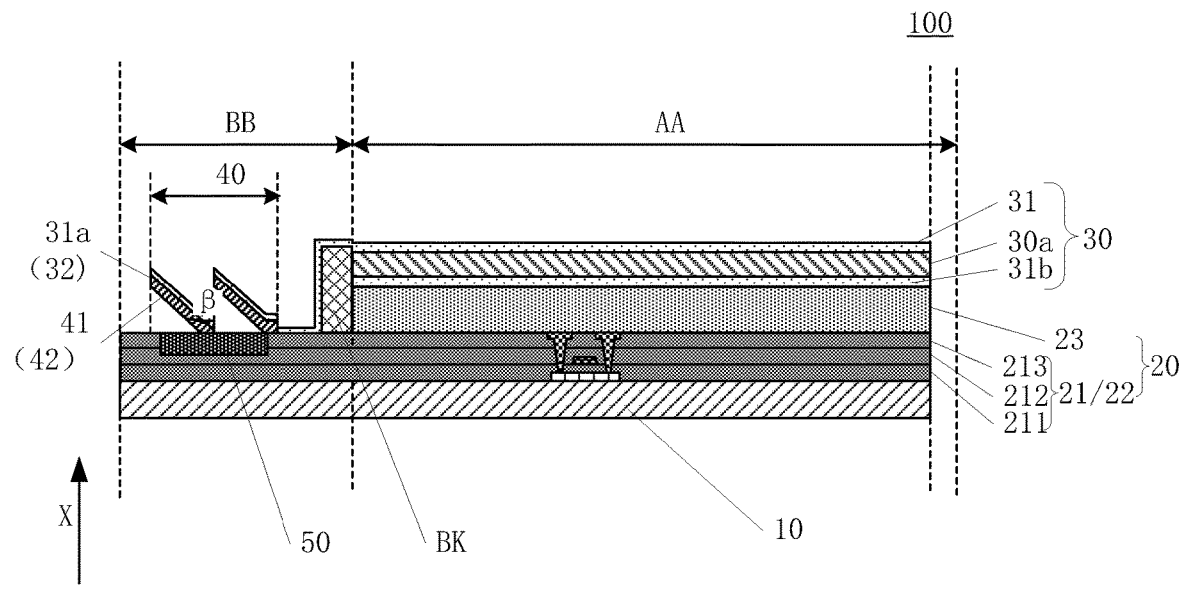
FIG. 4 illustrates a schematic sectional view of another exemplary flexible display panel consistent with disclosed embodiments of the present disclosure.

FIG. 4 illustrates a schematic sectional view of another flexible display panel consistent with disclosed embodiments of the present disclosure. Referring to FIG. 4, an angle β between the inclined portion 42 and the flexible substrate 10 may be an obtuse angle. In other words, the inclined portion 42 may be inclined away from the display region AA. In view of this, because the inorganic encapsulation layer 31a and the inorganic encapsulation layer 31 in the display region AA are disconnected, and the barrier wall BK is disposed on the periphery of the display region AA, the path of water and oxygen entering the inside of the display region AA may be blocked. Therefore, water and oxygen may be effectively prevented from entering the inside of the display region AA from the inorganic encapsulation layer, the risk of failure caused by expansion of cracks at the edge of the flexible display panel 100 may be reduced, and the reliability of the edge encapsulation of the flexible display panel 100 may be improved.

Further, the inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light emitted by the integrated device 50 may have a same optical path difference. Thus, the propagation of light may not be affected, thereby ensuring the accuracy of the light-exiting direction.

Referring to FIG. 4, the integrated device 50 may be disposed on the inorganic insulating layer 21. The inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the blocking region 40, the light may have an equal amount of phase delay.

When an integrated device for detecting phase is disposed on the inorganic insulating layer 21, the detected image may not have local distortion.

Figure 5:
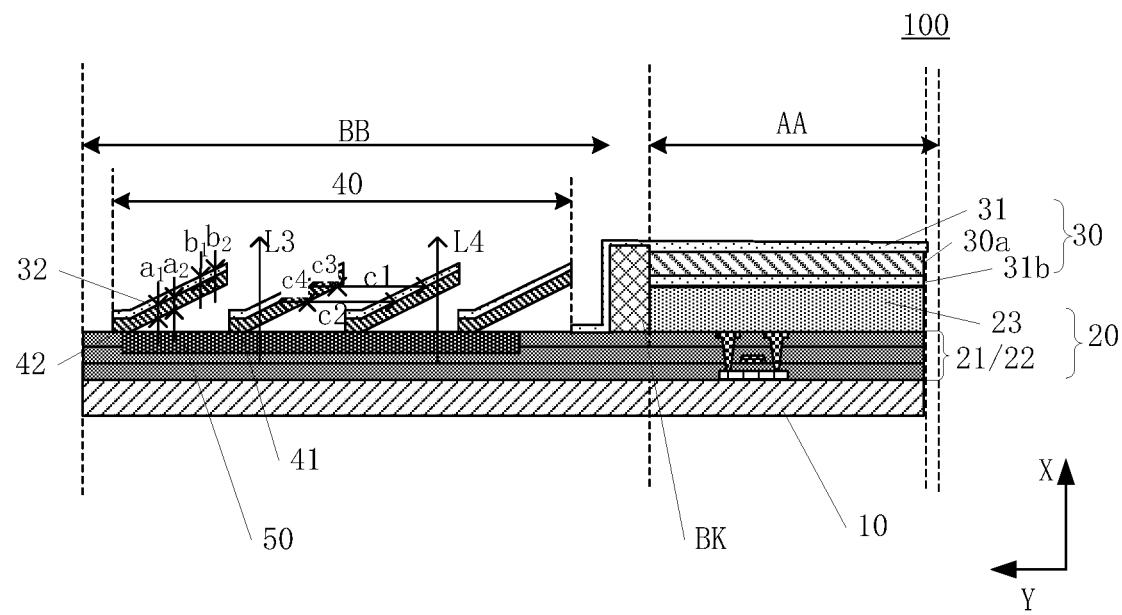
FIG. 5 illustrates a schematic sectional view of another exemplary flexible display panel consistent with disclosed embodiments of the present disclosure.

FIG. 5 illustrates a schematic sectional view of another flexible display panel consistent with disclosed embodiments of the present disclosure. Referring to FIG. 5, the flexible display panel 100 may further include a second direction Y. The second direction Y may be a direction parallel to the plane of the flexible substrate 10 and directed from the display region AA to the non-display region BB. The second direction Y may intersect the first direction X.

The flexible display panel 100 may further include the plurality of blocking structures 41. The spacing between any adjacent blocking structures 41 in the second direction Y may substantially equal to each other (c1=c2), and a thickness of each blocking structure 41 in the second direction Y may substantially equal to each other (c3=c4). The orthogonal projection of any adjacent blocking structures in the second direction are continuous and do not overlap. That is to say, each blocking structure has the same width (c1) in the second direction.

Referring to FIG. 5, the blocking region 40 may include the plurality of blocking structures 41. The plurality of blocking structures 41 may be disposed on the side of the inorganic insulating layer 21 away from the flexible substrate 10. Each blocking structure 41 may include the inclined portion 42, and the inclined portion 42 may have a same thickness at least in the first direction X (a1=a2). The inorganic encapsulation layer 31a disposed in the blocking region 40 may include the inclined segment 32, and the inclined segment 32 may have a same thickness at least in the first direction X (b1=b2). The spacing between any adjacent blocking structures 41 may substantially equal to each other, and the thickness of each blocking structure 41 in the second direction Y may substantially equal to each other. Because the spacing between any adjacent blocking structures 41 substantially equals to each other, and the thickness of each blocking structure 41 in the second direction Y substantially equals to each other, the blocking structures may be uniformly disposed. Referring to FIG. 5, the cross-section of the inclined portion 42 of the blocking structure 41 may be a parallelogram. Such uniform structure may facilitate fabrication. In the second direction, the orthogonal projection of any adjacent blocking structure is continuous and non-overlapping, avoiding the change of optical path difference caused by the overlapping of adjacent blocking structures or by good voids of adjacent blocking structures.

At the same time, the disposure of the plurality of blocking structures 41 may disconnect the inorganic encapsulation layer 31a in the direction directed from the non-display region BB to the display region AA. Therefore, the path of water and oxygen entering the inside of the inorganic encapsulation layer 31 may be blocked, a risk of failure caused by expansion of the cracks at the edge of the flexible display panel 100 may be reduced, and the reliability of the edge encapsulation of the flexible display panel 100 may be improved.

Further, the inclined portion 42 of the blocking structure 41 may have a same thickness at least in the first direction X, and the inclined segment 32 of the inorganic encapsulation layer 31a in the blocking region 40 may have a same thickness at least in the first direction X. When passing through the inclined segment 32, the light may have a same optical path difference. Thus, the propagation of light may not be affected, thereby ensuring the accuracy of the light-exiting direction.

In certain embodiments, the inorganic insulating layer 21 may include one or more layers of a buffer layer, a gate insulating layer and an interlayer insulating layer that are sequentially disposed. The blocking structure 41 may extend into any one layer of the inorganic insulating layer 21. The light-emitting function layer 20 may include the array layer 22 and the organic light-emitting layer 23. The array layer 22 in the non-display region BB may include the inorganic insulating layer 21.

Figure 6:
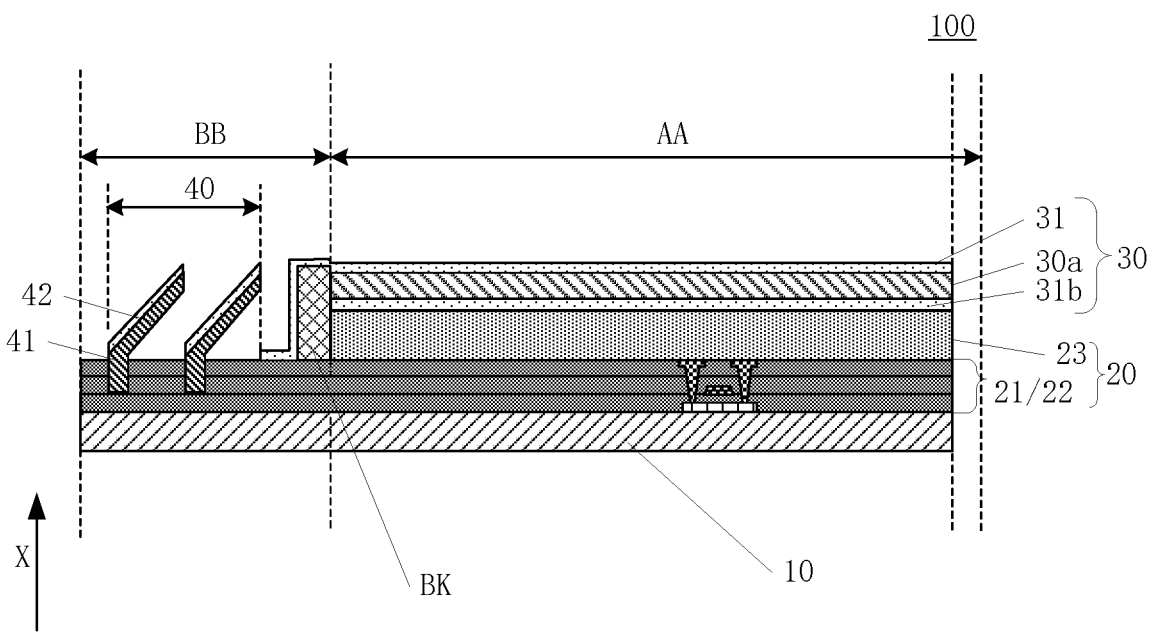
FIG. 6 illustrates a schematic sectional view of another exemplary flexible display panel consistent with disclosed embodiments of the present disclosure.

FIG. 6 illustrates a schematic sectional view of another flexible display panel consistent with disclosed embodiments of the present disclosure. For illustrative purposes, FIG. 6 merely illustrates one case of the inorganic insulating layer 21. The inorganic insulating layer 21 may include other cases of the buffer layer, the gate insulating layer and the interlayer insulating layer, which are not illustrated herein.

Referring to FIG. 6, a dry etching process may be performed on the inorganic insulating layer 21 before forming the blocking structure 41. After forming a notch by the dry etching process, the blocking structure 41 may be formed, and, thus, the blocking structure 41 may extend to any one layer of the inorganic insulating layers 21. Because the inorganic insulating layer 21 under the blocking structure 41 is disconnected, the path of water and oxygen entering the inside of the display region AA through the inorganic insulating layer 21 (any one or more layers of the buffer layer, the gate insulating layer and the interlayer insulating layer) may be blocked. Thus, the reliability of the edge encapsulation of the flexible display panel 100 may be further improved. At the same time, because the blocking structure 41 extends into the inorganic insulating layer 21, the blocking structure 41 may be reinforced, and, thus, the inclined portion 42 of the blocking structure 41 may be substantially stable.

Figure 7:
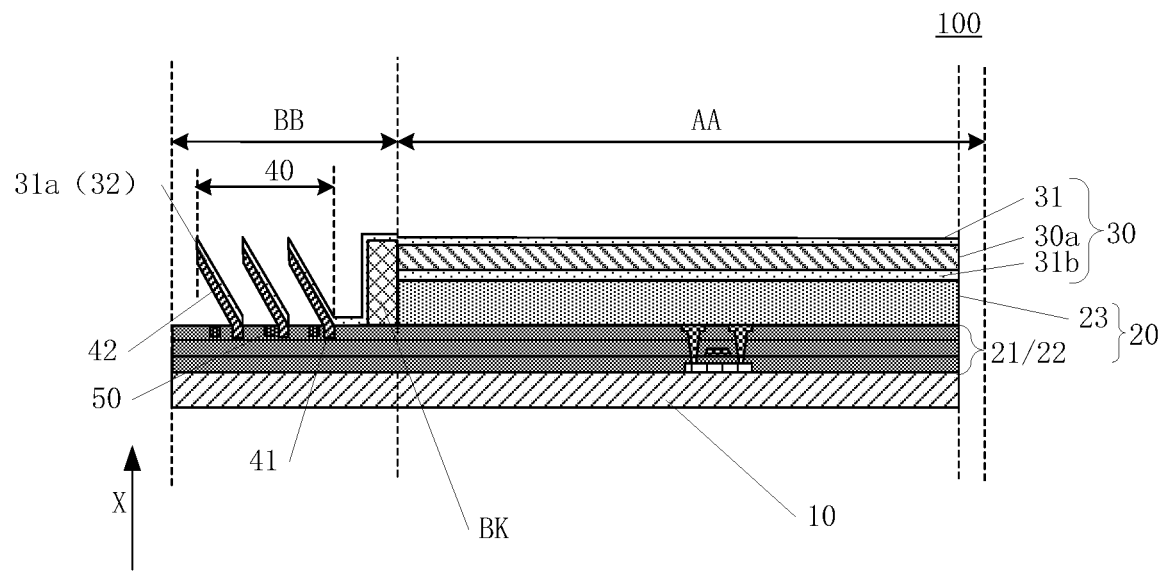
FIG. 7 illustrates a schematic sectional view of another exemplary flexible display panel consistent with disclosed embodiments of the present disclosure.

FIG. 7 illustrates a schematic sectional view of another flexible display panel consistent with disclosed embodiments of the present disclosure. Referring to FIG. 7, the flexible display panel 100 may include a plurality of integrated devices 50. The integrated devices 50 may be spaced apart by the blocking structures 41. The orthogonal projection of the inclined portion 42 of the blocking structure 41 on the flexible substrate 10 may cover the orthogonal projection of the integrated device 50 on the flexible substrate 10.

Referring to FIG. 7, the inclined portion 42 of the blocking structure 41 may have a same thickness at least in the first direction X, and the inclined segment 32 of the inorganic encapsulation layer 31a in the blocking region 40 may have a same thickness at least in the first direction X. The orthogonal projection of the inclined portion 42 of the blocking structure 41 on the flexible substrate 10 may cover the orthogonal projection of the integrated device 50 on the flexible substrate 10. When passing through the blocking region 40, the light may have a same optical path difference. Thus, the propagation of light may not be affected, thereby ensuring the accuracy of the light-exiting direction.

Figure 8:
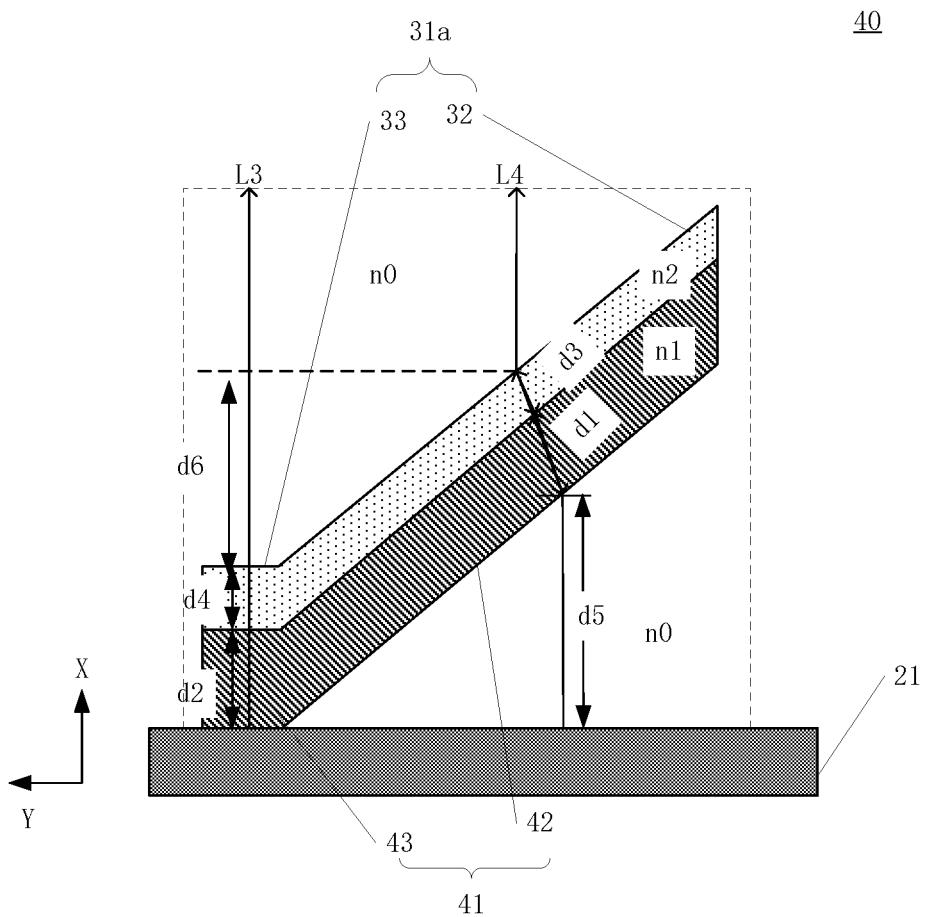
FIG. 8 illustrates a schematic diagram of a blocking region of an exemplary flexible display panel consistent with disclosed embodiments of the present disclosure.

FIG. 8 illustrates a schematic diagram of a blocking region of a flexible display panel consistent with disclosed embodiments of the present disclosure. Referring to FIG. 8, the blocking structure 41 may include a non-inclined portion 43. The blocking structure may be made of a material having a refractive index of n1. A thickness of the non-inclined portion in the first direction X is d2. The shortest distance between the incident point of light L4 entering the inclined portion 42 and the inorganic insulating layer 21 is d5. The distance of the light L4 travelling in the inclined portion 42 is d1.

The inorganic encapsulation layer 31a in the blocking region 40 may further include a non-inclined segment 33. The inorganic encapsulation layer may be made of a material having a refractive index of n2. A thickness of the non-inclined segment 33 in the first direction X is d4. The distance of the light travelling in the inclined segment is d3.

The shortest distance in the first direction X between an outgoing point of the light L4 passing through the inclined segment 32 and an outgoing point of the light L3 passing through the non-inclined segment 33 is d6. The second direction Y may be the direction parallel to the plane of the flexible substrate and directed from the display region to the non-display region. The second direction Y may intersect the first direction X.

The space between the inclined portion 42 and the inorganic insulating layer 21 may be filled with air having a refractive index of n0. The space on a side of the inorganic encapsulation layer 31a away from the inorganic insulating layer 21 may be filled with air having the refractive index of n0, where $n1 \times d2 + n2 \times d4 + n0 \times d6 = n0 \times d5 + n1 \times d1 + n2 \times d3$.

In one embodiment, when passing through the non-inclined portion 43 and the non-inclined segment 33, the light L3 may not be refracted. Thus, the optical path of the light L3 is $S3 = n1 \times d2 + n2 \times d4 + n0 \times d6$.

When sequentially passing through the inclined portion 42 and the inclined segment 32, the light L4 may be refracted. The optical path of the light L4 is $S4 = n0 \times d5 + n1 \times d1 + n2 \times d3$.

The optical path S3 of the light L3 may have to be equal to the optical path S4 of the light L4, and, thus, the light passing through the blocking region may have a same optical path difference, and the propagation of the light may not be affected. When an integrated device for detecting phase is disposed on the inorganic insulating layer, the detected image may not have local distortion.

Figure 9:
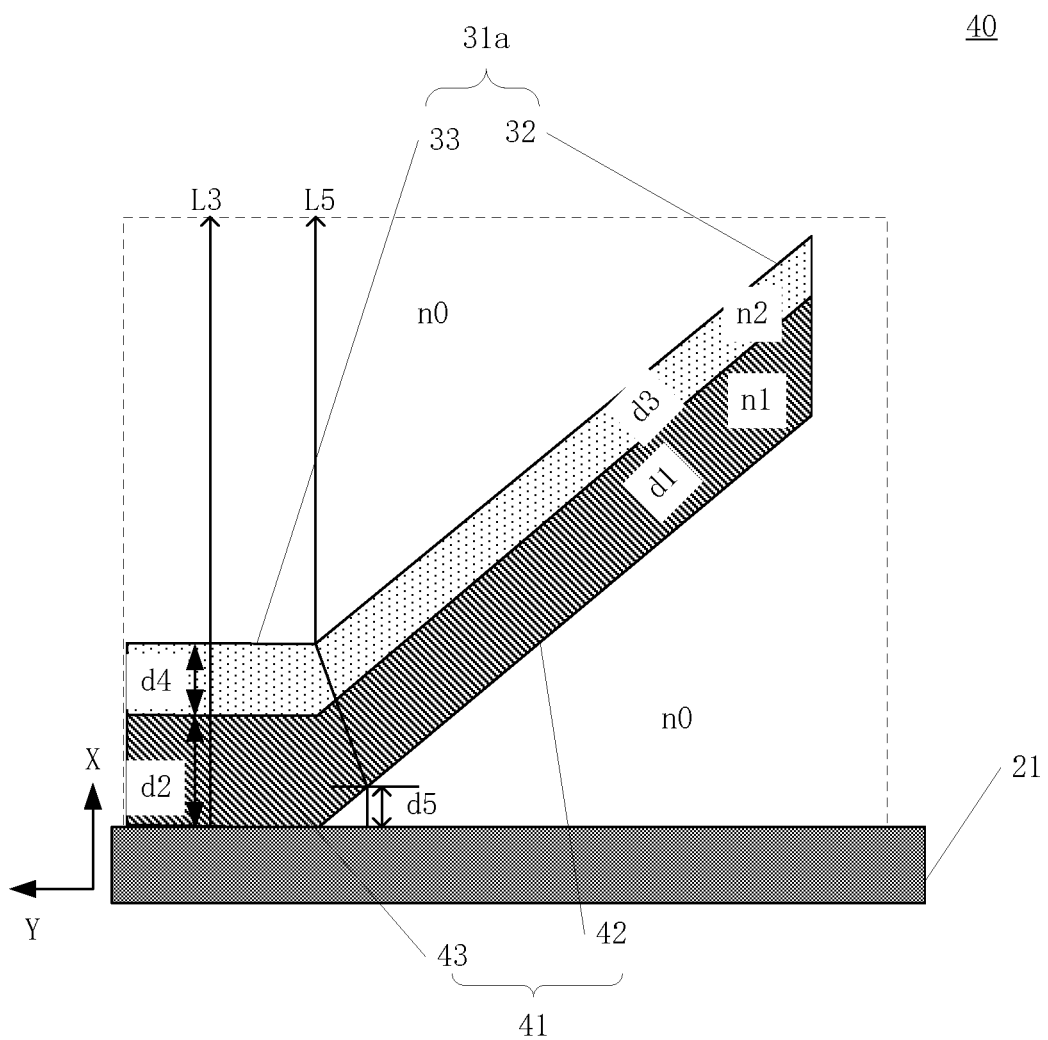
FIG. 9 illustrates a schematic diagram of a blocking region of another exemplary flexible display panel consistent with disclosed embodiments of the present disclosure.

In another embodiment, when the outgoing point of the light is located at the intersection of the inclined segment and the non-inclined segment, d6=0, and, thus, $n1 \times d2 + n2 \times d4 = n0 \times d5 + n1 \times d1 + n2 \times d3$. FIG. 9 illustrates a schematic diagram of a blocking region of another flexible display panel consistent with disclosed embodiments of the present disclosure. Referring to FIG. 9, the blocking structure 41 may include the non-inclined portion 43. The blocking structure may be made of a material having a refractive index of n1. A thickness of the non-inclined portion in the first direction X is d2. The shortest distance between the incident point of light L5 entering the inclined portion 42 and the inorganic insulating layer 21 is d5. The distance of the light L5 travelling in the inclined portion 42 is d1.

The inorganic encapsulation layer 31a in the blocking region 40 may further include a non-inclined segment 33. The inorganic encapsulation layer may be made of a material having a refractive index of n2. A thickness of the non-inclined segment 33 in the first direction X is d4. The distance of the light travelling in the inclined segment is d3. An outgoing point of the light L5 passing through the inclined segment 32 may be the intersection of the inclined segment 32 and the non-inclined segment 33. The space between inclined portion 42 and the inorganic insulating layer 21 may be filled with air having the refractive index of n0. The space on a side of the inorganic encapsulation layer 31a away from the inorganic insulating layer 21 may be filled with air having the refractive index of n0, where $n1 \times d2 + n2 \times d4 = n0 \times d5 + n1 \times d1 + n2 \times d3$.

In one embodiment, when passing through the non-inclined portion 43 and the non-inclined segment 33, the light L3 may not be refracted. Thus, the optical path of the light L3 is $S3 = n1 \times d2 + n2 \times d4$.

When sequentially passing through the inclined portion 42 and the inclined segment 32, the light L5 may be refracted. The optical path of the light L5 is $S5 = n0 \times d5 + n1 \times d1 + n2 \times d3$.

The optical path S3 of the light L3 may have to be equal to the optical path S5 of the light L5, i.e., $n1 \times d2 + n2 \times d4 = n0 \times d5 + n1 \times d1 + n2 \times d3$. Thus, the light passing through the blocking region may have a same optical path difference, and the propagation of the light may not be affected. When an integrated device for detecting phase is disposed on the inorganic insulating layer, the detected image may not have local distortion.

Referring to FIG. 1, the blocking structure 41 may be made of a material including at least one of an ultraviolet imprinting adhesive, a thermoset imprinting adhesive, and a polydimethylsiloxane. The ultraviolet imprinting adhesive, the thermoset imprinting adhesive, or the polydimethylsiloxane may be formed into the blocking structure 41 by nanoimprinting. Because such materials may be formed into the nanoscale blocking structure 41, the cost may be substantially low, and the resolution may be high. The formed blocking structure 41 may have desired uniformity and repeatability.

Figure 10:
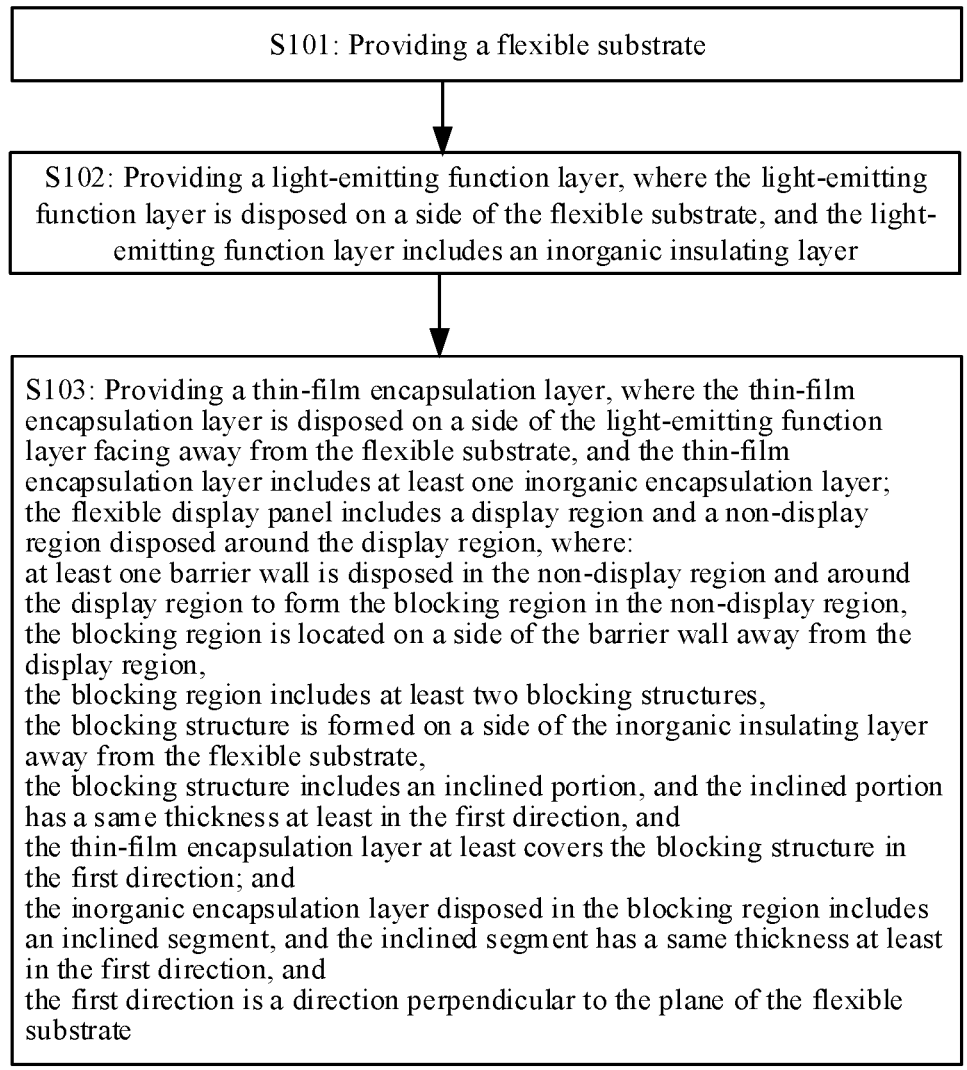
FIG. 10 illustrates a flow chart of an exemplary fabrication method for forming a flexible display panel consistent with disclosed embodiments of the present disclosure.

The present disclosure also provides a fabrication method for forming a flexible display panel, which may be used to fabricate the flexible display panels described in the above embodiments. FIG. 10 illustrates a flow chart of the fabrication method for forming the flexible display panel consistent with disclosed embodiments of the present disclosure. Referring to FIG. 10, the fabrication method for forming the flexible display panel may include the following.

S101: Providing a flexible substrate.

S102: Providing a light-emitting function layer. The light-emitting function layer may be disposed on a side of the flexible substrate, and the light-emitting function layer may include an inorganic insulating layer. In one embodiment, the light-emitting function layer may include an array layer and an organic light-emitting layer, and the array layer in the non-display region may include the inorganic insulating layer.

S103: Providing a thin-film encapsulation layer. The thin-film encapsulation layer may be disposed on a side of the light-emitting function layer facing away from the flexible substrate. The thin-film encapsulation layer may include at least one inorganic encapsulation layer.

The flexible display panel may include a display region and a non-display region disposed around the display region. At least one barrier wall may be disposed in the non-display region and around the display region to form a blocking region in the non-display region. The blocking region may be located on a side of the barrier wall away from the display region. The blocking region may include at least two blocking structures. The blocking structure may be formed on a side of the inorganic insulating layer away from the flexible substrate. The blocking structure may include an inclined portion, and the inclined portion may have a same thickness at least in the first direction. The thin-film encapsulation layer may at least cover the blocking structure in the first direction. The inorganic encapsulation layer disposed in the blocking region may include an inclined segment, the inclined segment may have a same thickness at least in the first direction. The first direction may be a direction perpendicular to the plane of the flexible substrate.

In other words, in the above embodiment, the light-emitting function layer may be first formed, then the blocking structure may be formed in the non-display region of the display panel, and ultimately the thin-film encapsulation layer may be formed. The inorganic encapsulation layer of the thin-film encapsulation layer disposed in the blocking region may cover the blocking structure in the first direction.

In the formed flexible display panel, the disposure of the blocking structure in the blocking region may disconnect the inorganic encapsulation layer in the direction directed from the display region to the non-display region. Thus, the path of water and oxygen entering the inside of the display region through the inorganic encapsulation layer may be blocked, a risk of failure caused by expansion of the cracks at the edge of the flexible display panel may be reduced, and the reliability of the edge encapsulation of the flexible display panel may be improved.

On the other hand, the inclined portion of the blocking structure may have a same thickness at least in the first direction, and the inclined segment of the inorganic encapsulation layer in the blocking region may have a same thickness at least in the first direction. When passing through the blocking region, the light may have a same optical path difference. Thus, the propagation of light may not be affected, thereby ensuring the accuracy of the light-exiting direction.

In one embodiment, the blocking structure may be formed on the flexible substrate by a nanoimprinting method. Instead of using visible or ultraviolet light to process the pattern, the nanoimprinting process uses mechanical means for pattern transfer, which may achieve a high resolution. In addition, the nanoimprinting template for forming the blocking structure may be repeatedly used, which may greatly reduce the processing cost and effectively shorten the processing time. The blocking structure may be formed on the flexible substrate by an inkjet printing or holographic exposure in the prior art, which is not specifically limited herein.

The method for forming the blocking structure on the flexible substrate by a nanoimprinting method may include the following. An imprinting material may be bonded to the flexible substrate by a nanoimprinting mold, and the nanoimprinting mold may be provided with a pattern with a certain inclination angle. The inclined blocking structure may be formed after demolding. An angle between the inclined portion of the blocking structure and the flexible substrate may be an acute angle or an obtuse angle. The imprinting material may be one selected from the ultraviolet imprinting adhesive, the thermoset imprinting adhesive, and the polydimethylsiloxane.

The nanoimprinting mold may be provided with a pattern with a certain inclination angle, and the inclined blocking structure may be formed after demolding. In view of this, the fabrication process may be substantially simple, and the repeatability may be substantially high. The angle between the inclined portion of the blocking structure and the flexible substrate may be an acute angle or an obtuse angle, which may be determined according to practical applications. When the angle between the inclined portion of the blocking structure and the flexible substrate is an acute angle, the arrangement thereof may be referred to FIG. 3. When the angle between the inclined portion of the blocking structure and the flexible substrate is an obtuse angle, the arrangement thereof may be referred to FIG. 1.

In one embodiment, an aspect ratio of the pattern on the nanoimprinting mold may be less than 2. When a pattern with a certain inclination angle is provided on the nanoimprinting mold, and the inclined blocking structure is formed after demolding, because it is not easy for the inclined pattern to be demolded, the aspect ratio of the pattern cannot be too large. A too large aspect ratio may not facilitate demolding, and a desired aspect ratio may be less than 2. In view of this, not only the inclined blocking structure may be formed, but also the demolding may be simple.

In another embodiment, the method for forming the blocking structure on the flexible substrate by a nanoimprinting method may include the following. An imprinting material may be bonded to the flexible substrate by a nanoimprinting mold, and the nanoimprinting mold may be provided with a vertical pattern. The inclined blocking structure may be formed after demolding. An angle between the blocking structure and the flexible substrate may be an acute angle or an obtuse angle.

Figure 11:
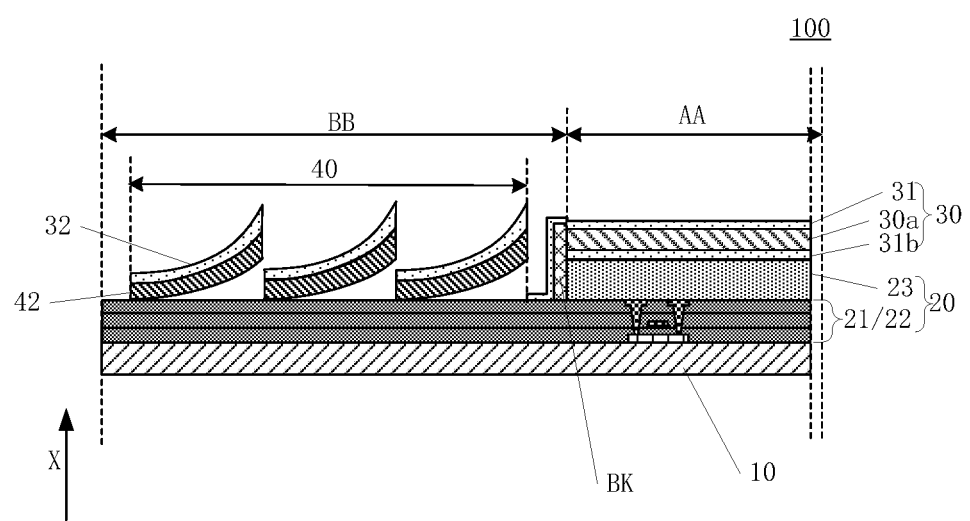
FIG. 11 illustrates a schematic diagram of a blocking structure formed after nanoimprinting and demolding of a flexible display panel consistent with disclosed embodiments of the present disclosure.

Similarly, the vertical pattern may be provided on the nanoimprinting mold. In view of this, the vertical pattern may have a high aspect ratio, because the pattern with a high aspect ratio is unevenly stressed, the demolded blocking structure may have a certain natural inclination. Thus, the inclined blocking structure may be formed after nanoimprinting and demolding. FIG. 11 illustrates a schematic diagram of a blocking structure formed after nanoimprinting and demolding of a flexible display panel consistent with disclosed embodiments of the present disclosure. Referring to FIG. 11, the purpose of blocking water and oxygen may be achieved. In addition, referring to FIG. 11, the inclined portion may have a same thickness. The angle between the inclined portion of the blocking structure and the flexible substrate may be an acute angle or an obtuse angle, which may be determined according to practical applications.

In one embodiment, the nanoimprinting mold may be a soft imprinting mold. When the nanoimprinting adopts a vertical pattern provided on the nanoimprinting mold, and the inclined blocking structure is formed after demolding, a curved inclined blocking structure may be likely to be formed by the nanoimprinting mold as the soft imprinting mold. Because the degree of hardness of the soft imprinting mold is different, the degree of bending of the formed blocking structure may be different.

Figure 12:
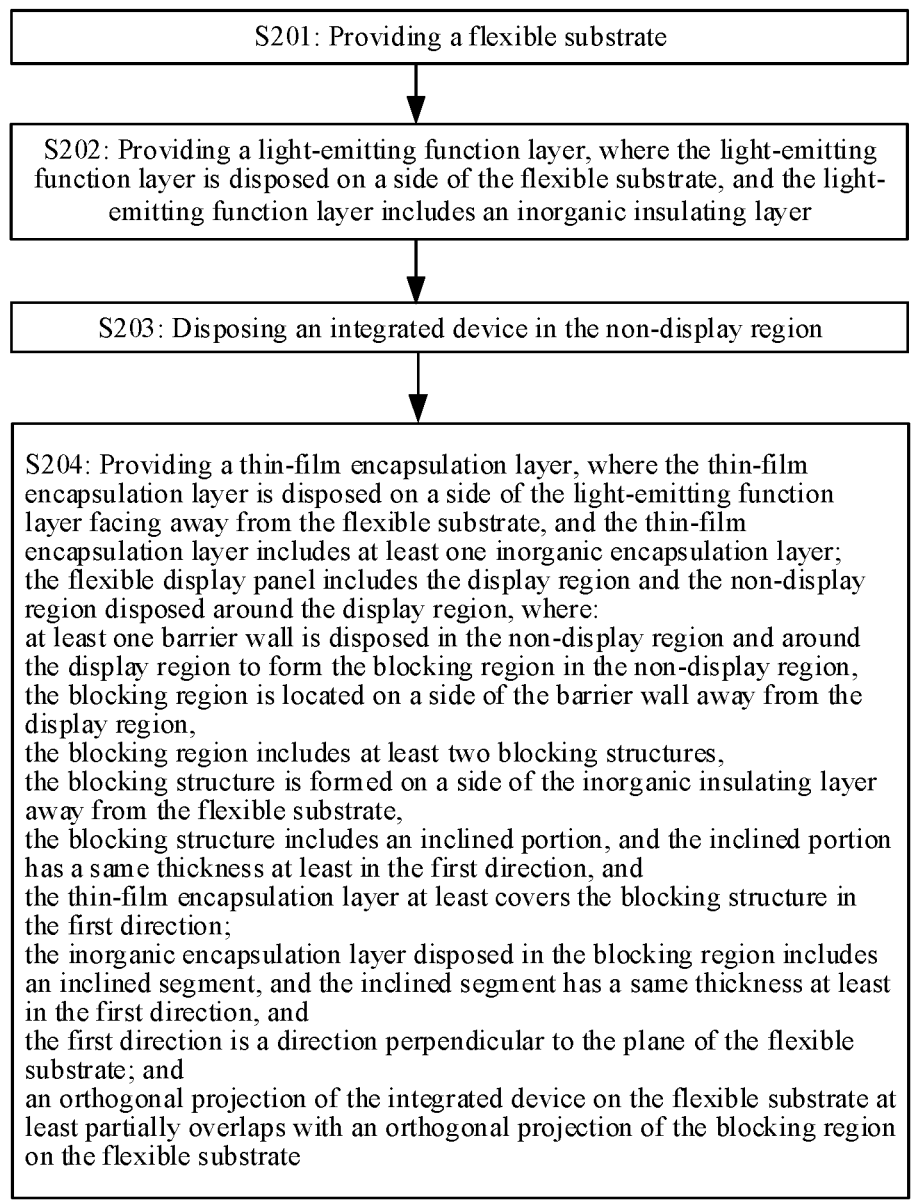
FIG. 12 illustrates a flow chart of another exemplary fabrication method for forming a flexible display panel consistent with disclosed embodiments of the present disclosure.

FIG. 12 illustrates a flow chart of another fabrication method for forming the flexible display panel consistent with disclosed embodiments of the present disclosure. Referring to FIG. 12, the fabrication method for forming the flexible display panel may include the following.

S201: Providing a flexible substrate.

S202: Providing a light-emitting function layer. The light-emitting function layer may be disposed on a side of the flexible substrate, and the light-emitting function layer may include an inorganic insulating layer. In one embodiment, the light-emitting function layer may include an array layer and an organic light-emitting layer, and the array layer in the non-display region may include the inorganic insulating layer.

S203: Disposing an integrated device in the non-display region.

S204: Providing a thin-film encapsulation layer. The thin-film encapsulation layer may be disposed on a side of the light-emitting function layer facing away from the flexible substrate, and the thin-film encapsulation layer may include at least one inorganic encapsulation layer.

The flexible display panel may include the display region and the non-display region disposed around the display region. At least one barrier wall may be disposed in the non-display region and around the display region to form the blocking region in the non-display region. The blocking region may be located on a side of the barrier wall away from the display region. The blocking region may include at least two blocking structures. The blocking structure may be formed on a side of the inorganic insulating layer away from the flexible substrate. The blocking structure may include an inclined portion, and the inclined portion may have a same thickness at least in the first direction. The thin-film encapsulation layer may at least cover the blocking structure in the first direction. The inorganic encapsulation layer disposed in the blocking region may include an inclined segment, and the inclined segment may have a same thickness at least in the first direction. The first direction may be a direction perpendicular to the plane of the flexible substrate.

An orthogonal projection of the integrated device on the flexible substrate may at least partially overlap with an orthogonal projection of the blocking region on the flexible substrate. After forming the light-emitting function layer, the integrated device may be disposed on the inorganic insulating layer or on any other film layer. In the above embodiment, the light-emitting function layer may be first formed, then the blocking structure may be formed in the non-display region of the display panel, and ultimately the thin-film encapsulation layer may be formed. The inorganic encapsulation layer of the thin-film encapsulation layer disposed in the blocking region may cover the blocking structure in the first direction.

In the formed flexible display panel, the disposure of the blocking structure in the blocking region may disconnect the inorganic encapsulation layer in the direction directed from the display region to the non-display region. Thus, the path of water and oxygen entering the inside of the display panel through the inorganic encapsulation layer may be blocked, a risk of failure caused by expansion of the cracks at the edge of the flexible display panel may be reduced, and the reliability of the edge encapsulation of the flexible display panel may be improved.

On the other hand, the inclined portion of the blocking structure may have a same thickness at least in the first direction, and the inclined segment of the inorganic encapsulation layer disposed in the blocking region may have a same thickness at least in the first direction. When passing through the blocking region, the light emitted by the integrated device may have a same optical path difference. Thus, the propagation of light may not be affected, thereby ensuring the accuracy of the light-exiting direction.

In one embodiment, before forming the blocking structure on the side of the inorganic insulating layer away from the flexible substrate, the inorganic insulating layer may be etched to form a plurality of notches. The blocking structure may be extended into the notch, and the detailed structure of the blocking structure may be referred to FIG. 6. The inorganic insulating layer may include one or more layers of a buffer layer, a gate insulating layer, and an interlayer insulating layer that are sequentially disposed. A dry etching process may be performed on the inorganic insulating layer to form the plurality of notches. Then the blocking structure may be formed by the nanoimprinting method, and, thus, the blocking structure may be smoothly extended into the notch. Because the notch is formed by etching the inorganic insulating layer, the path of water and oxygen entering the inside of the display region through the inorganic insulating layer may be blocked. Thus, the reliability of the edge encapsulation of the flexible display panel may be further improved. At the same time, because the blocking structure is extended into the inorganic insulating layer, the stability of the blocking structure may be reinforced.

In one embodiment, after forming the blocking structure on the inorganic insulating layer, the fabrication method may further include a process of curing the blocking structure. The curing process may include ultraviolet curing or heat curing. After the blocking structure is formed, the blocking structure may be reinforced by curing, and the cured blocking structure may be substantially stable. The ultraviolet curing may refer to that under the illumination of ultraviolet, the photoactive initiator (or photosensitizer) absorbs ultraviolet light to produce active radicals or cations, which initiates monomer polymerization, cross-linking and adduct chemical reactions, such that the adhesive is converted from a liquid state into a solid state within a few seconds. Such method may be featured with advantages such as fast curing, controllable reaction, no solvent and no pollution. Heat curing may refer to that two or more substances in the system are chemically reacted by heating or at a certain temperature and then cured. The heat-cured adhesive may have a desired flexibility and desired adhesion.

In the disclosed display panel, because the evaporation layer is not resistant to high temperature or ultraviolet fixation, the nanoimprinting process may have to be performed before evaporating the thin-film encapsulation layer.

After forming the blocking structure, the fabrication method may further include an ashing process. In one embodiment, the imprinting material may be bonded to the flexible substrate by a nanoimprinting mold, and the nanoimprinting mold may be provided with a pattern with a certain inclination angle. The inclined blocking structure may be formed after demolding. An angle between the inclined portion of the blocking structure and the flexible substrate may be an acute angle or an obtuse angle. In another embodiment, the imprinting material may be bonded to the flexible substrate by a nanoimprinting mold, and the nanoimprinting mold may be provided with a vertical pattern. The inclined blocking structure may be formed after demolding. An angle between the blocking structure and the flexible substrate may be an acute angle or an obtuse angle. An ashing treatment may have to be performed on the formed blocking structure to avoid the residual adhesive generated during the nanoimprinting process to block a via. The via may refer to a via disposed on the insulating layer, e.g., a gate insulating layer or an interlayer insulating layer, for the connection between metal layers. In addition, to prevent the residual adhesive generated during the nanoimprinting process from blocking the via, the nanoimprinting process may be performed before disposing the via.

Figure 13:
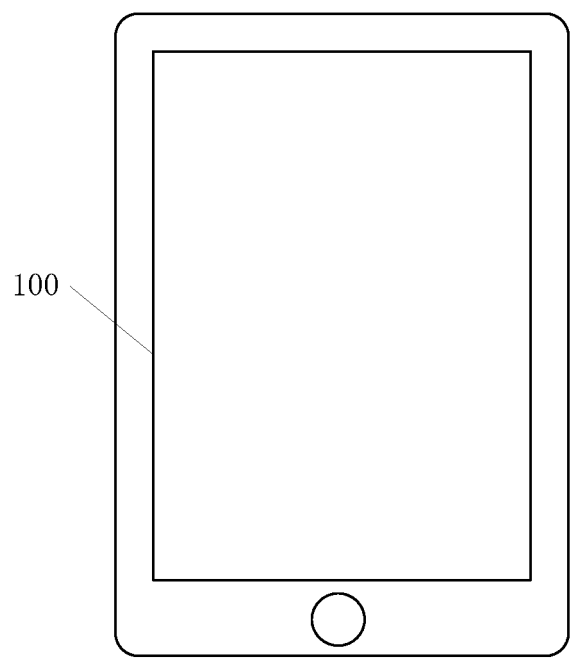
FIG. 13 illustrates an exemplary flexible display device consistent with disclosed embodiments of the present disclosure.

The present disclosure also provides a flexible display device 200. The flexible display device 200 may include any one of the flexible display panels 100 in the disclosed embodiments. FIG. 13 illustrates the flexible display device consistent with disclosed embodiments of the present disclosure. Referring to FIG. 13, the flexible display device 200 may include any one of the flexible display panels 100 in the disclosed embodiments. For illustrative purposes, FIG. 13 illustrates a mobile phone as a flexible display device for description. The flexible display device in the present disclosure may include a computer, a television, a tablet computer, an electronic paper book, an in-vehicle display device, and any other suitable flexible display device having a display function, which is not limited by the present disclosure. The display device in the disclosed embodiments may also have the beneficial effects of the display panel described in the above embodiments, which are not repeated herein In the flexible display panel and fabrication method, and the flexible display device in the disclosed embodiments, the non-display region of the flexible display panel may include at least one barrier wall disposed around the display region. The non-display region may also include the blocking region disposed on the side of the barrier wall away from the display region. The blocking region may include the blocking structure disposed on the side of the inorganic insulating layer away from the flexible substrate. The blocking structure may include the inclined portion, and the inclined portion may have a same thickness at least in the first direction.

The flexible display panel may also include the thin-film encapsulation layer disposed on the side of the light-emitting function layer facing away from the flexible substrate. The thin-film encapsulation layer may include at least one inorganic encapsulation layer. The inorganic encapsulation layer disposed in the blocking region may include the inclined segment, and the inclined segment may have a same thickness at least in the first direction. The first direction may be a direction perpendicular to the plane of the flexible substrate.

On the one hand, the disposure of the blocking region may block the path of water and oxygen entering the inside of the display region through the inorganic encapsulation layer, reduce a risk of failure caused by expansion of the cracks at the edge of the flexible display panel, and improve the reliability of the edge encapsulation of the flexible display panel.

On the other hand, the inclined portion of the blocking structure may have a same thickness at least in the first direction, and the inclined segment of the inorganic encapsulation layer in the blocking region may have a same thickness at least in the first direction. When passing through the blocking region, the light may have a same optical path difference. Thus, the propagation of light may not be affected, thereby ensuring the accuracy of the light-exiting direction.

In addition, the inclined portion of the blocking structure may have a same thickness at least in the first direction, and the inclined segment of the inorganic encapsulation layer in the blocking region may have a same thickness at least in the first direction. When passing through the blocking region, the light may have an equal amount of phase delay. When an integrated device for detecting phase is disposed on the inorganic insulating layer, the detected image may not have local distortion.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments illustrated herein but is to be accorded the widest scope consistent with the principles and novel features disclosed herein.

What is claimed is:

1. A flexible display panel, comprising:
   a flexible substrate;
   a light-emitting function layer disposed on a side of the flexible substrate, wherein the light-emitting function layer includes an inorganic insulating layer;
   a display region and a non-display region disposed around the display region, wherein the non-display region includes:
      at least one barrier wall disposed around the display region,
      a blocking region disposed on a side of the barrier wall away from the display region, wherein:
         light passing through the blocking region in a direction perpendicular to the flexible substrate has a uniform optical path difference,
         the blocking region includes a blocking structure disposed on a side of the inorganic insulating layer away from the flexible substrate,
         the blocking structure includes an inclined portion, and
         the inclined portion has a same thickness at least in a first direction; and
   a thin-film encapsulation layer disposed on a side of the light-emitting function layer facing away from the flexible substrate, wherein:
      the thin-film encapsulation layer at least covers the blocking structure in the first direction,
      the thin-film encapsulation layer includes at least one inorganic encapsulation layer,
      the inorganic encapsulation layer disposed in the blocking region includes an inclined segment, and
      the inclined segment has a same thickness at least in the first direction, wherein the first direction is a direction perpendicular to a plane of the flexible substrate.

2. A flexible display panel, comprising:
   a flexible substrate;
   a light-emitting function layer disposed on a side of the flexible substrate, wherein the light-emitting function layer includes an inorganic insulating layer;
   a display region and a non-display region disposed around the display region, wherein the non-display region includes:
      at least one barrier wall disposed around the display region,
      a blocking region disposed on a side of the barrier wall away from the display region, wherein:
         the blocking region includes a blocking structure disposed on a side of the inorganic insulating layer away from the flexible substrate,
         the blocking structure includes an inclined portion, and
         the inclined portion has a same thickness at least in a first direction; and
      an integrated device disposed on the inorganic insulating layer, wherein an orthogonal projection of the integrated device on the flexible substrate at least partially overlaps with an orthogonal projection of the blocking region on the flexible substrate; and
   a thin-film encapsulation layer disposed on a side of the light-emitting function layer facing away from the flexible substrate, wherein:
      the thin-film encapsulation layer at least covers the blocking structure in the first direction,
      the thin-film encapsulation layer includes at least one inorganic encapsulation layer,
      the inorganic encapsulation layer disposed in the blocking region includes an inclined segment, and
      the inclined segment has a same thickness at least in the first direction, wherein the first direction is a direction perpendicular to a plane of the flexible substrate.

3. The flexible display panel according to claim 1, wherein:
   an angle between the inclined portion and the flexible substrate is one of an acute angle and an obtuse angle.

4. The flexible display panel according to claim 1, wherein:
   a second direction is parallel to the plane of the flexible substrate and directed from the display region to the non-display region, wherein the second direction intersects the first direction; and the flexible display further includes a plurality of blocking structures, wherein a spacing between any adjacent blocking structures in the second direction substantially equals to each other, and a thickness of each blocking structure in the second direction substantially equals to each other;

orthogonal projections of any adjacent blocking structures in the second direction are continuous and do not overlap.

5. The flexible display panel according to claim 1, wherein:

the inorganic insulating layer includes one or more layers of a buffer layer, a gate insulating layer and an interlayer insulating layer, that are sequentially disposed, and the blocking structure is capable of extending into any one layer of the inorganic insulating layer.

6. The flexible display panel according to claim 2, further including:

a plurality of integrated devices each spaced apart by the blocking structure, wherein an orthogonal projection of the inclined portion of the blocking structure on the flexible substrate covers an orthogonal projection of a corresponding integrated device of the plurality of integrated devices on the flexible substrate.

7. The flexible display panel according to claim 1, wherein:

the blocking structure further includes a non-inclined portion, the blocking structure is made of a material having a refractive index of $n1$, a thickness of the non-inclined portion in the first direction is $d2$, a shortest distance between an incident point of light entering the inclined portion and the inorganic insulating layer is $d5$, and a distance of light travelling in the inclined portion is $d1$;

the inorganic encapsulation layer in the blocking region further includes a non-inclined segment, the inorganic encapsulation layer is made of a material having a refractive index of $n2$, a thickness of the non-inclined segment in the first direction is $d4$, a distance of light travelling in the inclined segment is $d3$, and a shortest distance in the first direction between an exiting point of light passing through the inclined segment and an outgoing point of light passing through the non-inclined segment is $d6$; and space between the inclined portion and the inorganic insulating layer is filled with air having a refractive index of $n0$, and space on a side of the inorganic encapsulation layer away from the inorganic insulating layer is filled with air having a refractive index of $n0$, wherein $n1 \times d2 + n2 \times d4 + n0 \times d6 = n0 \times d5 + n1 \times d1 + n2 \times d3$.

8. The flexible display panel according to claim 7, wherein:

when the exiting point of light passing through the inclined segment is located at an intersection of the inclined segment and the non-inclined segment, $d6=0$.

9. The flexible display panel according to claim 1, wherein:

the blocking structure is made of a material including at least one of an ultraviolet imprinting adhesive, a thermoset imprinting adhesive, and a polydimethylsiloxane.

10. A flexible display device, comprising the flexible display panel according to claim 1.

11. A fabrication method for forming a flexible display panel, comprising:

providing a flexible substrate;

providing a light-emitting function layer, wherein the light-emitting function layer is disposed on a side of the flexible substrate, and the light-emitting function layer includes an inorganic insulating layer;

providing a thin-film encapsulation layer, wherein the thin-film encapsulation layer is disposed on a side of the light-emitting function layer facing away from the flexible substrate, and the thin-film encapsulation layer includes at least one inorganic encapsulation layer, wherein:

the flexible display panel includes a display region and a non-display region disposed around the display region;

at least one barrier wall is disposed in the non-display region and around the display region to form a blocking region in the non-display region, the blocking region is located on a side of the barrier wall away from the display region, light passing through the blocking region in a direction perpendicular to the flexible substrate has a uniform optical path difference, the blocking region includes at least two blocking structures disposed on a side of the inorganic insulating layer away from the flexible substrate, a blocking structure of the at least two blocking structures includes an inclined portion, and the inclined portion has a same thickness at least in a first direction, and the thin-film encapsulation layer at least covers the blocking structure in the first direction; and the inorganic encapsulation layer disposed in the blocking region includes an inclined segment, and the inclined segment has a same thickness at least in the first direction, and the first direction is a direction perpendicular to a plane of the flexible substrate.

12. The fabrication method according to claim 11, wherein:

the blocking structure is formed above the flexible substrate by a nanoimprinting method.

13. The fabrication method according to claim 12, wherein forming the blocking structure on the flexible substrate by the nanoimprinting method includes:

bonding an imprinting material to the flexible substrate by a nanoimprinting mold, providing the nanoimprinting mold with a pattern with a certain inclination angle, and forming the inclined blocking structure after demolding, wherein an angle between the inclined portion of the blocking structure and the flexible substrate is one of an acute angle and an obtuse angle.

14. The fabrication method according to claim 13, wherein:

an aspect ratio of the pattern on the nanoimprinting mold is less than 2.

15. The fabrication method according to claim 12, wherein forming the blocking structure on the flexible substrate by the nanoimprinting method includes:

bonding an imprinting material to the flexible substrate by a nanoimprinting mold, providing the nanoimprinting mold with a vertical pattern, and forming the inclined blocking structure after demolding, wherein an angle between the blocking structure and the flexible substrate is one of an acute angle and an obtuse angle.

16. The fabrication method according to claim 15, wherein:

the nanoimprinting mold is a soft imprinting mold.

17. The fabrication method according to claim 11, further including:

disposing an integrated device in the non-display region, wherein an orthogonal projection of the integrated device on the flexible substrate at least partially overlaps with an orthogonal projection of the blocking region on the flexible substrate.

18. The fabrication method according to claim 11, wherein:

before forming the blocking structure on the side of the inorganic insulating layer away from the flexible substrate, the inorganic insulating layer is etched to form a plurality of notches, and the blocking structure extends into a notch of the plurality of notches.

19. The fabrication method according to claim 11, further including:

a curing process of the blocking structure, wherein the curing process includes one of an ultraviolet curing and a heat curing.

20. The fabrication method according to claim 12, after forming the blocking structure, further including:

an ashing process.

* * * * *